United States Patent [19]
Montalbano et al.

[11] Patent Number: 5,606,262
[45] Date of Patent: Feb. 25, 1997

[54] MANIPULATOR FOR AUTOMATIC TEST EQUIPMENT TEST HEAD

[75] Inventors: Christopher P. Montalbano; Gregory A. Montalbano, both of Great Neck; Anthony P. Montalbano, Shelter Island Hgts.; Eric C. Fleischer, Rockville Centre, all of N.Y.

[73] Assignee: Teradyne, Inc., Boston, Mass.

[21] Appl. No.: 481,564

[22] Filed: Jun. 7, 1995

[51] Int. Cl.$^6$ .................................................. G01R 31/27
[52] U.S. Cl. .................... 324/758; 73/866.5; 324/757; 324/765
[58] Field of Search ................. 73/866.5; 324/757, 324/758, 765; 437/8; 414/935, 936; 29/593, 407, 705; 240/124.1, 124.2, 326

[56] References Cited

U.S. PATENT DOCUMENTS

| | | | |
|---|---|---|---|
| 3,824,843 | 7/1974 | Gebeshaber et al. | 73/640 |
| 3,826,383 | 7/1974 | Richter | 214/1 BD |
| 3,862,578 | 1/1975 | Schlüter | 73/866.5 |
| 4,062,455 | 12/1977 | Flatau | 214/1 CM |
| 4,076,131 | 2/1978 | Dahlstrom et al. | 214/1 BC |
| 4,132,318 | 1/1979 | Wang et al. | 214/1 BB |
| 4,188,166 | 2/1980 | Moreau et al. | 414/735 |
| 4,199,294 | 4/1980 | Streck | 414/739 |
| 4,229,136 | 10/1980 | Panissidi | 414/673 |
| 4,264,266 | 4/1981 | Trechsel | 414/730 |
| 4,273,506 | 6/1981 | Thomson et al. | 414/735 |
| 4,299,529 | 11/1981 | Inaba et al. | 414/590 |
| 4,303,368 | 12/1981 | Dent et al. | 414/590 |
| 4,488,435 | 12/1984 | Kastl et al. | 73/618 |
| 4,527,942 | 6/1985 | Smith | 414/590 |
| 4,588,346 | 5/1986 | Smith | 414/673 |
| 4,589,815 | 5/1980 | Smith | 324/758 |
| 4,694,230 | 9/1987 | Slocum et al. | 318/568 |
| 4,695,024 | 9/1987 | Haven | 248/281.1 |
| 4,705,447 | 11/1987 | Smith | 414/590 |
| 4,715,574 | 12/1987 | Holt et al. | 248/297 |
| 4,742,980 | 5/1988 | Heigl | 248/125 |
| 4,857,838 | 8/1989 | Willberg | 324/158 F |
| 4,893,074 | 1/1990 | Holt et al. | 324/758 |
| 4,893,511 | 1/1990 | Voigt et al. | 73/622 |
| 4,943,020 | 6/1990 | Beaucoup et al. | 248/124 |
| 4,973,015 | 11/1990 | Beacoup et al. | 248/124.2 |
| 5,030,869 | 7/1991 | Holt et al. | 324/758 |
| 5,109,718 | 5/1992 | Gugel et al. | 73/866.5 |
| 5,135,196 | 8/1992 | Schehr | 248/324 |
| 5,149,029 | 9/1992 | Smith | 248/124 |
| 5,163,649 | 11/1992 | Schehr | 248/287 |
| 5,241,870 | 9/1993 | Holt | 73/866.5 |
| 5,440,943 | 8/1995 | Holt et al. | 324/758 X |

FOREIGN PATENT DOCUMENTS

| | | | |
|---|---|---|---|
| 241139 | 11/1986 | Germany | 324/758 |
| 4007011 | 9/1991 | Germany | 73/866.5 |
| 15584 | 1/1994 | Japan | 73/866.5 |

Primary Examiner—Thomas P. Noland
Attorney, Agent, or Firm—Edmund J. Walsh

[57] ABSTRACT

A manipulator for holding and positioning a test head which is used with automatic test equipment. The manipulator includes a horizontal telescoping member attached to a vertical column. The test head is attached to an assembly suspended from this member. Six planes of free motion of the test head are provided. The column can pivot around a vertical axis. The telescoping member can move up and down along the column and can telescope in and out. The test head assembly can pivot about a vertical axis. Within the assembly, the test head can rotate around two orthogonal vertical axes. This arrangement allows the test head to be positioned into a wide variety of positions. The manipulator includes a set of cable support rings which reduces the forces a cable places on the test head when it is moved. This arrangement allows a prober to be positioned beneath the test head so that the manipulator occupies very little floor space.

16 Claims, 4 Drawing Sheets

5,606,262

MANIPULATOR FOR AUTOMATIC TEST EQUIPMENT TEST HEAD

This invention relates generally to precisely positioning heavy objects and more specifically to a device for positioning the test head portion of automatic test equipment.

Automatic test equipment is used by manufacturers of semiconductor chips. Semiconductor chips are tested as early as possible in the manufacturing process to avoid the cost of processing defective chips. Generally, the chips are tested before they are packaged. To test chips in this form, probes must be placed directly onto the chip because leads through which the chip is normally accessed are not added until the chip is packaged.

The probes are attached to a portion of the automatic test equipment called a "test head." The test head is connected through a cable to a mainframe cabinet, which holds a major portion of the electronic circuitry needed to generate and analyze test signals. The test head is supported by a manipulator, which allows the test head to be moved.

To test a chip, the chip is mounted in a device called a prober. The test head is then moved by a human operator to bring the probes into contact with the chip. The test head is secured in this position, and testing is performed. The process of moving and securing the test head in a position in which electrical contact can be made to the chip is called "docking."

Various factors make the docking process extremely difficult. First, the semiconductor chip is very small, on the order of a fraction of a square inch. Hundreds of test signals must often be coupled to the chip. The contact points for these test signals must all fit onto the small chip, requiring them to be very small. The test head must be precisely positioned so that all of the probes line up with all of the contact points.

Achieving precise positioning of the test head is complicated because the test head can weigh hundreds of pounds. The weight is largely caused by the need to position some electronic circuitry as close as possible to the chip being tested. The weight makes it difficult to move the test head. In addition, the test head can put excessive force on the prober, causing the prober to deflect. If the prober deflects, it is much more difficult to achieve precise positioning of the probes relative to the chip in the prober.

A further complicating factor is that the cable connecting the test head to the mainframe cabinet is very heavy and exhibits hysteresis. A cable can weigh hundreds of pounds. The cable weight can create forces on the test head. Because the cable exhibits hysteresis, these forces can change when the cable is moved. Thus, the manipulator must precisely position the test head despite the changing forces.

A further complicating factor is that different probers are often used with the same automatic test equipment. Different probers hold the semiconductor chip in different configurations. The manipulator must be able to position the test head to dock regardless of the type of prober used. Sometimes the test head is positioned horizontally above the prober with the probes facing down. In other instances it is positioned horizontally below the prober with the probes facing up. For other probers, the test head is positioned vertically with the probes facing sideways. Still other probers require the test head to be positioned at some angle between horizontal and vertical.

Various design techniques have been employed to facilitate docking. High precision manufacturing techniques are employed to ensure there is as little slack as possible in the manipulator. Hard stops are built into the manipulator to help it return repeatedly to the same position. Also, the contact area between the prober and the test head is made as large as possible to average out any deflections.

To make positioning easier and to reduce deflection caused by the weight of the test head, counter weight schemes have been proposed such as in U.S. Pat. No. 4,973,015 to Beaucoup et al. and in U.S. Pat. Nos. 4,527,942, 4,705,447, 4,588,346, 4,589,815 and 5,149,029 all to Smith. Also to ameliorate problems caused by the weight of the test head, some manipulators include motors or other drive mechanisms.

To reduce the effect of the weight of the cable, arrangements have been proposed to support the weight of the cable. Such arrangements are shown in U.S. Pat. Nos. 4,893,074 and 5,030,869 to Holt et al.

Despite use of these design techniques, current manipulators can not always easily dock a test head with a prober. Often, two people are needed to handle the test head to get it into position. Even when the test head appears to be docked, numerous adjustments are sometimes needed to make electrical contact to all of the test points on the integrated circuit chip.

Also, the prior art manipulators and cable support mechanisms take up a significant amount of floor space. Manufacture of semiconductor components must be done in a clean room, which is very expensive to operate. To reduce costs, the room should be as small as possible. There is, therefore, a great advantage in using less floor space.

SUMMARY OF THE INVENTION

With the foregoing background in mind, it is an object of the invention to provide a manipulator which allows a test head to be easily positioned.

It is also an object to provide a manipulator which reduces the affects of cable portions on the position of a test head.

The foregoing and other objects are achieved in a manipulator having a telescoping horizontal member from which a test head is suspended. The test head is suspended in a yoke which can rotate with respect to the horizontal member about a plurality of axes.

In one embodiment, the manipulator also includes a plurality of support elements, also suspended from the horizontal member, which support a cable attached to the test head. According to one feature of the invention, the plurality of support elements are rings which are connected together through joints which allow the cable to bend as the test head rotates. According to another feature of the invention, the rings have movable interior surfaces which allow the cable to rotate as the test head rotates.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
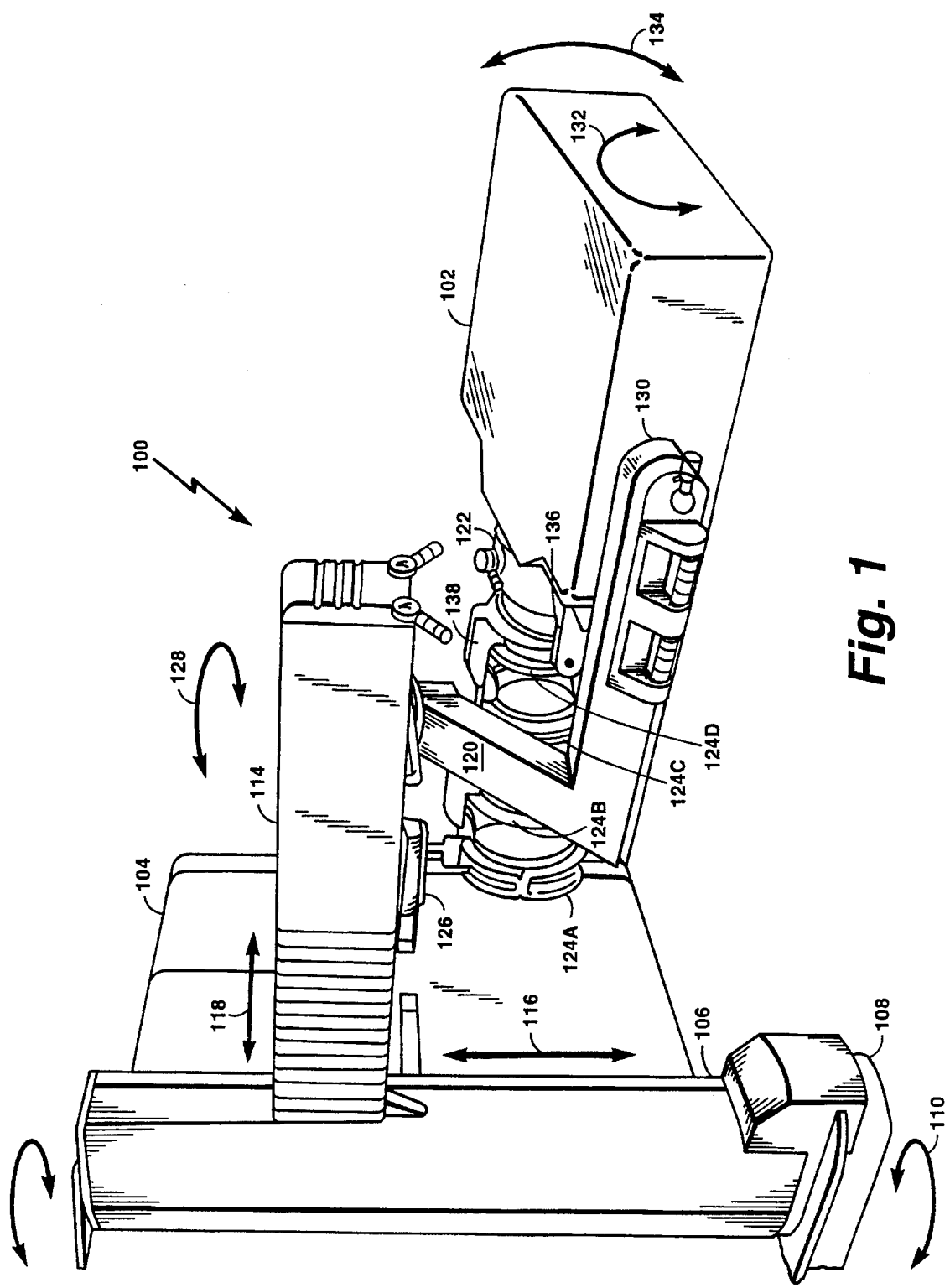
FIG. 1 is an isometric view, partially cut away, of a manipulator according to the invention.

FIG. 1 shows an isometric projection of manipulator 100 constructed according to the invention. Manipulator 100 supports test head 102. Test head 102 is connected to tester cabinet 104 through a cable (not shown).

Manipulator 100 contains a column assembly 106. Column assembly 106 is mounted, through bearings (not shown), to a plate 108. Column assembly 106 may thus rotate in the swing direction 110.

Plate 108 extends under tester cabinet 104. The weight of tester cabinet 104 stabilizes manipulator 100.

Figure 2:
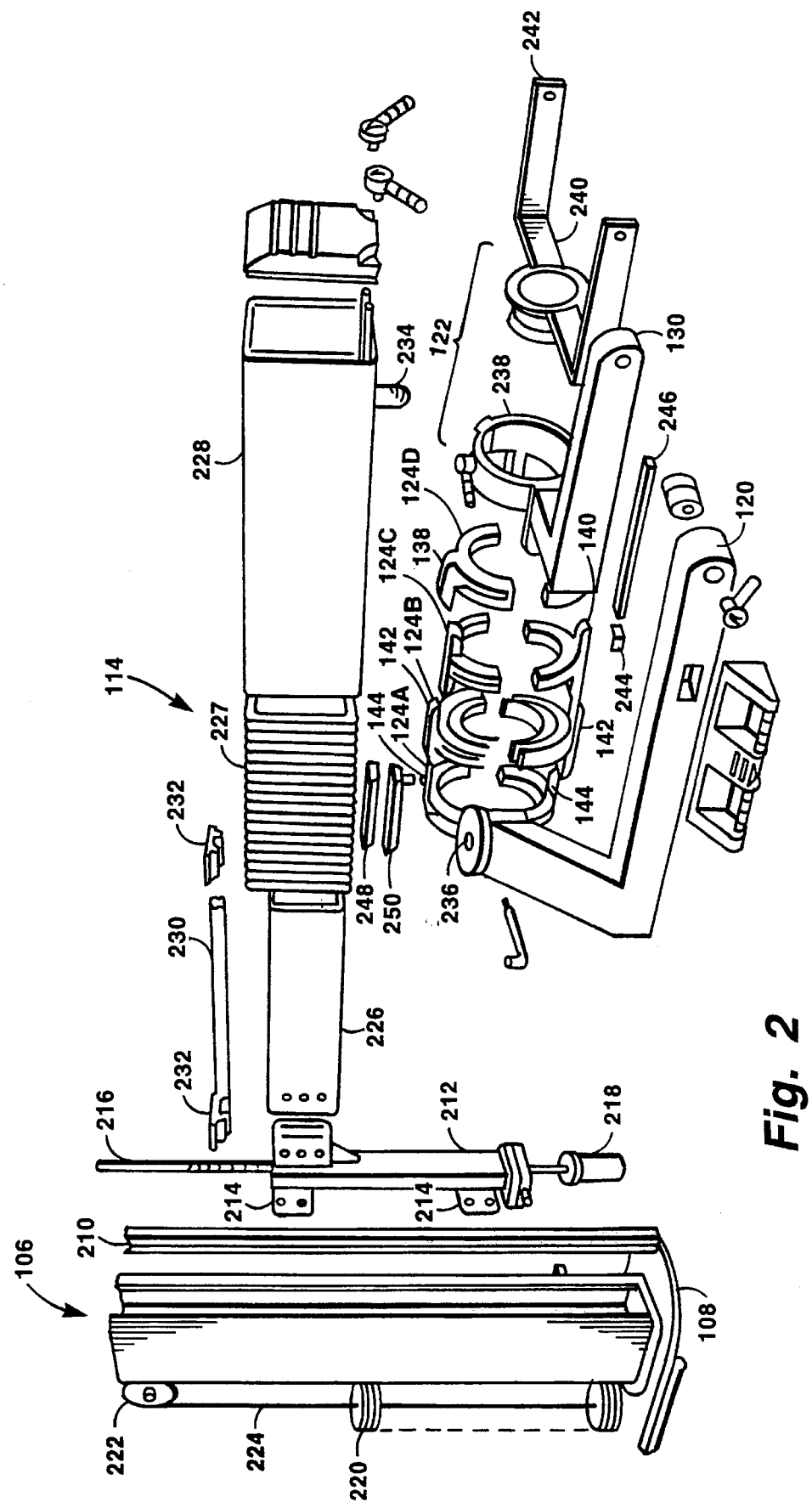
FIG. 2 is an exploded view of the manipulator of FIG. 1.

Boom assembly 114 is mounted to column assembly 106 through linear bearings (214, FIG. 2). Thus, boom assembly 114 may move in vertical direction 116.

Boom assembly 114 is made in two pieces (226, 228, FIG. 2) to allow telescoping in transverse direction 118.

Prime yoke 120 is suspended from boom assembly 114. Prime yoke 120 is mounted in a post (234, FIG. 2) projecting from the underside of boom assembly 114. Prime yoke 120 can thus rotate in yaw direction 128.

Secondary yoke 130 is mounted to prime yoke 120. Secondary yoke 130 attached to prime yoke 120 through a pivot or bearing to allow a slight amount of rotation of secondary yoke 130 relative to prime yoke 120. Such rotation is desirable to aligning test head 102 with a device under test. A rotation of approximately +/– 10° is sufficient with a preferred embodiment having a range of rotation of +/– 7°.

Secondary yoke 130 contains a bearing assembly 122. Test head 102 rests in a cradle (242, FIG. 2) which is connected to secondary yoke 130 through bearing assembly 122. In this way, test head 102 can rotate in roll direction 132. Because test head 102 is mounted to the cradle (242, FIG. 2) through pivots, it can be moved in pitch direction 134.

Cable support rings 124A . . . 124D support a cable (not shown) connected to test head 102. Cable support ring 124D is connected to secondary yoke 130 through arms 136. The connection is made through a pivot to allow cable support ring 124D to move in the pitch direction. Cable support ring 124C is connected to ring 124D where arms 138 and 140 interface. The interface between arms 138 and 140 is jointed to allow cable support ring 124C to rotate in the yaw direction. Likewise, support ring 124B is connected to support ring 124C and support ring 124A is connected to support ring 124B.

Support ring 124A is held in place by ring support assembly 126. Ring support assembly 126 is connected to cable support 124A through a ball joint (not numbered). This connection ensures that cable support rings 124A . . . 124D are held in a horizontal plane.

Construction of support rings 124A . . . 124D is described in greater detail in conjunction with FIG. 3 below. Suffice it to say here that the inner surfaces of support rings 124A . . . 124D are designed to rotate freely. However, support rings 124A . . . 124D firmly grasp the cable to prevent it from sliding through any of the cable support rings 124A . . . 124D. Thus, support rings 124A . . . 124D support a cable (not shown) connected to test head 102. This support significantly reduces the forces placed in test head 102 by a cable. However, the cable support structure of the invention does not interfere with the motion of test head 102.

Figure 4:
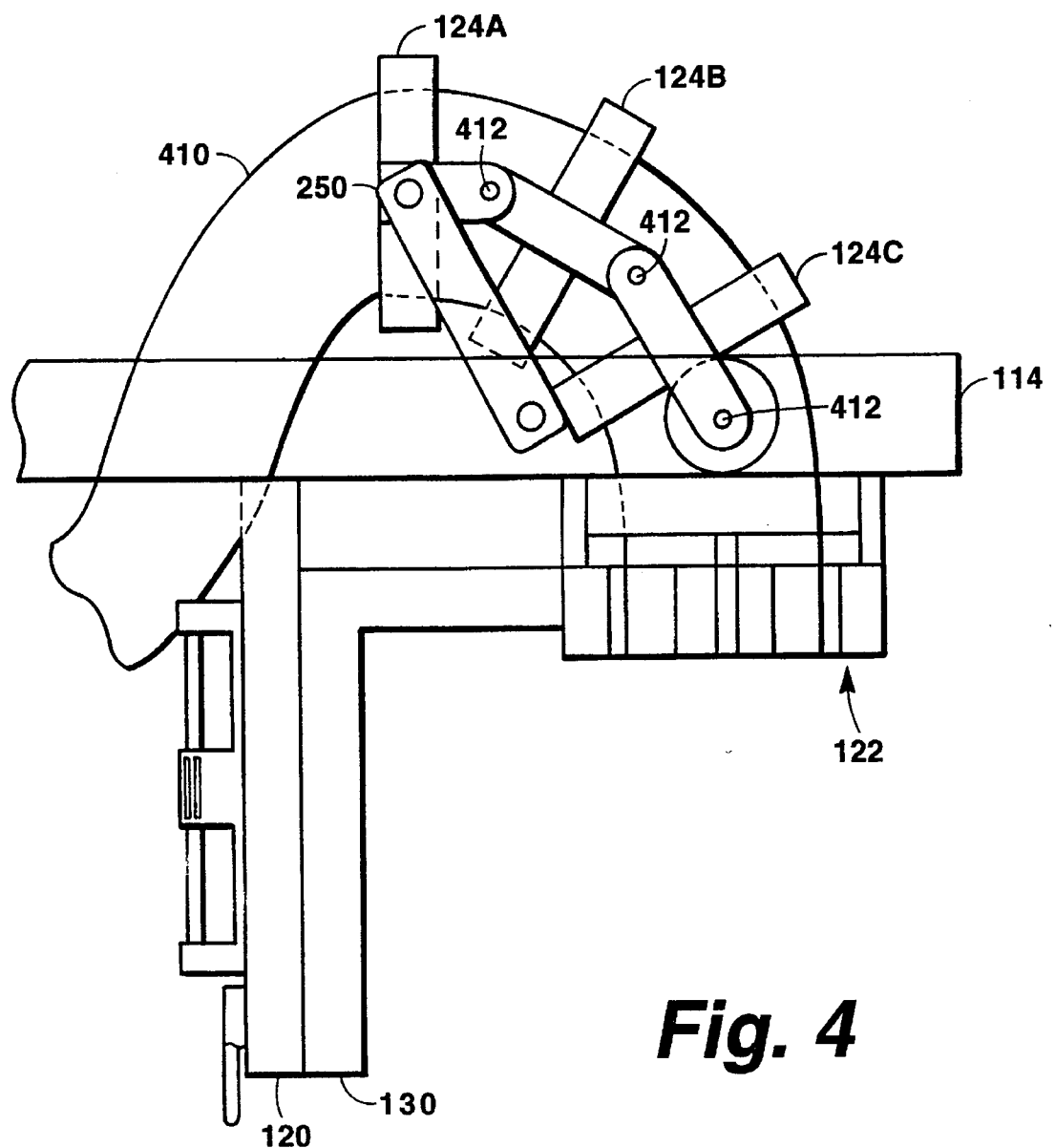
FIG. 4 shows one of the positions to which a test head supported by the manipulator of FIG. 1 can be moved.

For example, as test head 102 moves in yaw direction 128, cable support rings 124A . . . 124D take on a curved shape as depicted in FIG. 4. As test head 102 moves in pitch direction 134, ring 124D moves to accommodate motion of test head 102 relative to the cable. As test head 102 moves in roll direction 132, the cable freely rotates inside cable rings 124A . . . 124D. At all times, though, the cable is supported, reducing the force it applies on test head 102.

By use of the linear and rotary bearing assemblies illustrated in FIG. 1, test head 102 may be rotated in the roll, pitch and yaw directions. The height and transverse position of test head 102 may also be adjusted by moving boom assembly 114 in the vertical direction 116, horizontal direction 118 and swing direction 110. This range of motions allows for motion of the test head with six degrees of freedom.

Manipulator 100 includes a plurality of handles and locks (not numbered), such as are found in the art. The handles facilitate motion of the test head. For each axis about which motion is permitted, there is also a lock. Quite simply, the lock is disengaged to allow motion and engaged once test head 102 is moved to its desired position.

It should be noted that manipulator 100 takes up a very small amount of floor space which is not already occupied by other apparatus. For example, plate 108 extends under tester cabinet 104, allowing manipulator 100 to be placed very close to a tester. Also, test head 102 is suspended from boom assembly 114. The floor space under boom assembly 114 is not occupied by manipulator 100. A prober can thus be positioned very close to tester cabinet 104. The six degrees of free motion through which test head 102 can be moved allow docking to a prober even when it is positioned close to tester cabinet 104.

Turning now to FIG. 2, additional details of the construction of manipulator 100 are shown. Column assembly 106 is shown in exploded view to contain rail 210, which is mounted vertically.

Carriage 212 has mounted to it a pair of linear bearings 214. Linear bearings 214 engage rail 210 and allow carriage 212 to slide freely along rail 210.

Carriage 212 has lead screw 216 passing through it. Lead screw is connected at one end to motor 218. When motor 218 is actuated, lead screw 216 propels carriage 212 up or down along rail 210, imparting motion in the vertical direction.

Column assembly 106 also contains counterweights 220. Counterweights 220 are connected to cable 224, which passes over pulley 222 and connects to carriage 212. The weight of counterweights 220 is selected to counterbalance the weight of test head 102 (FIG. 1) and boom assembly 114. In this way, motor 218 can be relatively small and needs only to drive lead screw 216 against any slight out of balance condition of test head 102.

Boom assembly 114 has two major pieces: inner beam 226 and outer beam 228. Cowling 227 is principally included for aesthetic reasons.

Inner beam 226 is fixedly attached to carriage 212 at a right angle. Rail 230 is mounted to the upper surface of inner beam 226. Outer beam 228 is hollow and slides over inner beam 226. Linear bearings 232 are mounted to the inner surface of outer beam 228 and engage rail 230. The combination of linear bearings 232 and rail 230 allows outer beam 228 to slide along inner beam 226 so that boom assembly may telescope to provide horizontal motion.

Post 234 projects downward from the lower surface of outer beam 228. Post 238 is fixedly attached to outer beam 228.

Post 234 fits into bearing 236 in primary yoke 120. Bearing 236 holds primary yoke 120 to outer beam 228, but allows primary yoke 120 to rotate in the yaw direction about post 234.

Bearing assembly 122 is shown to include outer bearing ring 238, which is attached to secondary yoke 130. Inner bearing ring 240 fits inside outer bearing ring 238 and can rotate within it. Inner bearing ring 240 is connected to cradle 242.

Cradle 242 supports a test head (102, FIG. 1) at two pivot points at the ends of the cradle arms (not numbered). Both outer bearing ring 238 and inner bearing ring 240 are annular, allowing a cable to pass through them to make connection to a test head.

A test head (102, FIG. 1) is preferably mounted to cradle 242 with its center of gravity above and forward of the pivot points. This mounting position biases the test head to tip downwards in the yaw direction. However, the weight of the cable at the back of the test head compensates to some extent for this tendency. To more accurately balance the test head, a weight 244 can be attached to a slide 246. Slide 246 is attached to yoke 130 or to some other convenient point. Weight 244 may slide along slide 246 to provide additional counterbalancing force for the test head. Having an adjustable weight allows the test head to be balanced regardless of the weight of the test head and the cable.

FIG. 2 shows that ring support assembly 126 is made of two pieces. Mounting block 248 is attached to the underside of outer beam 228. Ball support member 250 is attached to mounting block 248, such as through a pivoting bearing in a track (not shown). This arrangement allows ball support member to move in a horizontal plane. With this arrangement, a cable attached to a test head (102, FIG. 1) can move as the test head is rotated in the yaw direction but still be supported by cable support rings 124A . . . 124D.

Figure 3:
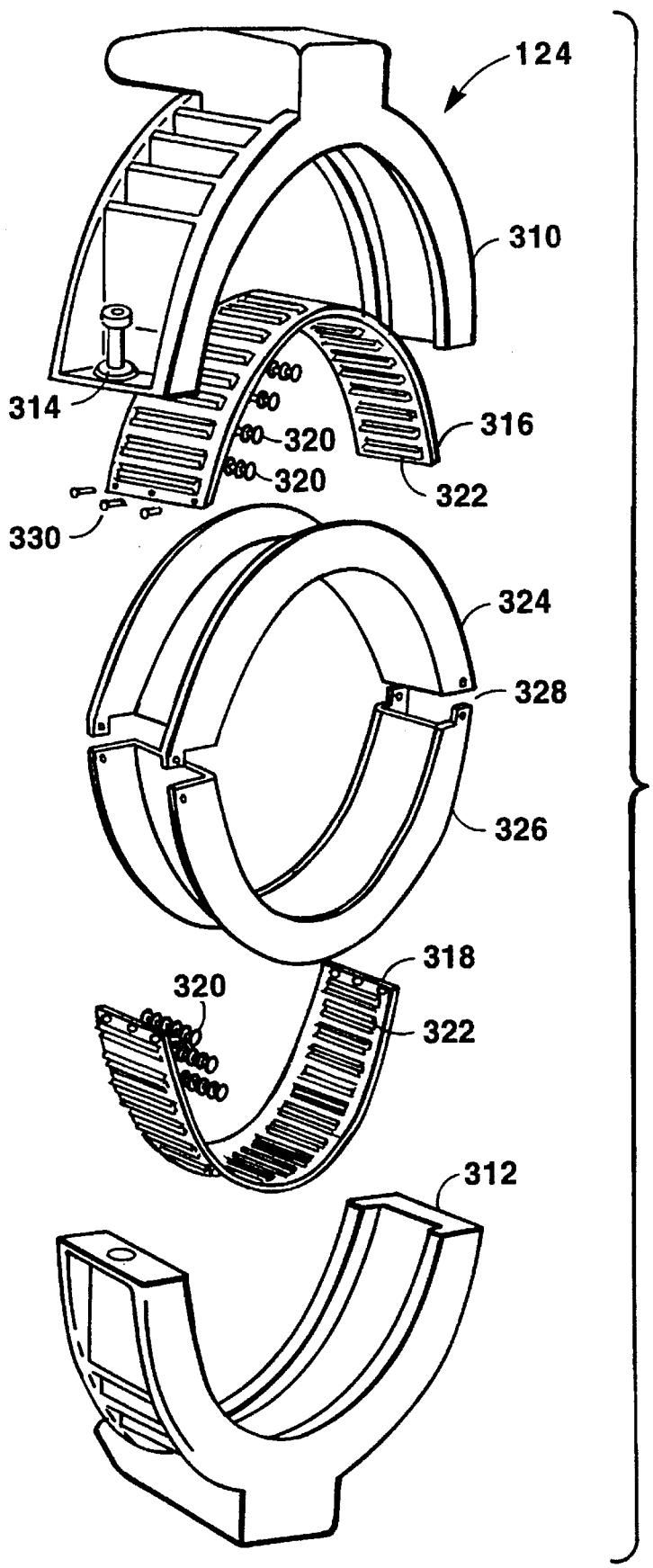
FIG. 3 is an exploded view of the cable support rings used in the manipulator of FIG. 1.

Turning now to FIG. 3, additional details of the construction of cable support rings 124A . . . 124D are shown. The outer portion of cable support ring 124 is made up of outer ring section 310 and outer ring section 312.

Into inner and outer ring sections 310 and 312, roller restraint sections 316 and 318, respectively, are mounted. Roller restraint sections have numerous recesses 322 formed in them. Rollers 320 fit into the recesses.

Rollers 320 are preferably disks. A group of rollers are threaded onto an axle (not shown) and inserted into one recess 322. This arrangement allows rollers 320 to roll freely in a direction along the circumference of roller restraint sections 316 and 318. It does not allow rollers 320 to move in any other direction.

Preferably, rollers 320 are held into recesses 322. The axles (not shown) could be attached to roller restraint sections 316 and 318. Alternatively, roller restraint sections 316 and 318 could contain tabs (not numbered) which hold rollers 320 in recesses 322.

Cable collar sections 324 and 326 also fit inside outer ring sections 310 and 312. Cable collar sections 324 and 326 have an inside diameter, when connected together, which is small enough to firmly grasp a cable.

Outer ring sections 310 and 312 are load bearing members and are preferably made of metal or other high strength material. Roller restraint section 316 and 318 and cable collar section 324 and 326 are not load bearing members. They can be made of plastic or other less expensive material.

Outer ring sections 310 and 312 are joined together such as through screws 314. While other methods of joining the sections might be used, screws or some other easily detachable means of joining the sections is preferred. It is desirable that cable support rings 124 come apart to allow them to be assembled around a cable.

Likewise, roller restraint sections 316 and 318 are joined through screws 330. Cable collar sections 324 and 326 are joined at tabs 328, such as with screws. Thus, the entire cable support ring 124 can be split in half for assembly around a cable.

Turning now to FIG. 4, a top view of manipulator 100 is shown to illustrate the operation of the cable support system of the invention. Cable 410 is shown passing through and supported by rings 124. Boom assembly 114 and yokes 120 and 130 are also shown.

As described above, prime yoke 120 is pivotally attached to boom assembly 114. FIG. 4 shows that prime yoke 120 is pivoted to a 90° angle with respect to boom assembly 114. As prime yoke 120 pivots, cable 410 must bend and move. Despite this movement, cable 410 is still supported by cable support rings 124.

The cable support rings 124 are held together at joints 412, which allow cable support rings 124 to bend into a serpentine shape. Since ball support 250 may move, it is not necessary that the support rings stay in a straight line under boom assembly 114. In this way, the cable is supported regardless of motion of test head 102.

Cable support rings 124 are constrained to stay in the horizontal plane which includes test head 102. Maintaining the cable in this horizontal plane reduces the force asserted by the cable on test head 102 when the test head is rotated in the roll direction.

Having described one embodiment, numerous alternative embodiments or variations might be made. For example, It is not essential that counter weights 220 be used. A more powerful motor might be used instead. Alternatively, more than one motor might be used. A motor might be used to pivot primary yoke 120. Motors may be included to facilitate ease of movement of test head 102.

Also, if counter weights are used, it is not necessary that they be included in column assembly 106. They might be mounted behind tester 104. If mounted further back, they might be connected to boom assembly 114 through a pulley assembly which reduced the amount of weight needed counter balance the test head.

Another variation might be to change the number of cable support rings 124. It is desirable that the cable be held in the same horizontal plane as the test head to the greatest extent possible to reduce cable force on the test head. Better support is achieved by having more cable support rings.

It was described that cable support ring 124D does not pivot in the yaw direction, but that cable support rings 124A . . 124C all pivot. It is desirable to have the cable enter the test head as straight as possible to reduce differential forces exerted by the cable on the test head. For that reason, it might be desirable to have some cable support rings near the test head not to pivot in the yaw direction. Alternatively, the range of the pivotal motion might be reduced for the cable support rings closer to the test head.

Also, manipulator 100 is shown to be attached to a tester 104. The manipulator could be made to be free standing.

Also, column assembly 106 is shown to be a vertical column. If the column were canted towards the test head by a small amount, say one half of a degree, test head 102 would tend to center itself if left unattended.

Therefore, the invention should be limited only by the spirit and scope of the appended claims.

What is claimed is:

1. A combination of a test head and a manipulator therefore comprising:

a) a column;

b) a telescoping boom slidably mounted to the column; and c) a test head assembly suspended below and pivotally mounted to the telescoping boom, the test head assembly comprising:
  i) a yoke pivotally mounted to the telescoping boom;
  ii) a bearing assembly attached to the yoke, said bearing assembly having an opening therethrough, the test head mounted to the bearing assembly; and
  iii) a cradle for supporting;
d) the test head, wherein the test head is pivotally mounted in the cradle through a point between the center of gravity of the test head and the bearing assembly.

2. The combination of claim 1 wherein the test head has a cable connection point facing the bearing assembly.

3. The combination of claim 2 additionally comprising a cable support attached to the test head assembly and to the telescoping boom.

4. A test station on a factory floor comprising the combination of claim 1, the station having a tester for testing semiconductor elements with the test head and, a prober for positioning the semiconductor elements, and wherein:
  a) the telescoping boom forms a horizontal member mounted above the floor; and
  b) the prober is positioned below the horizontal member.

5. The test station of claim 4 wherein the tester comprises a tester body and a cable connecting the test head to the tester body and additionally comprising a cable support structure connected at one end to the test head assembly and connected at another end to the horizontal member.

6. The test station of claim 5 wherein the test head assembly includes means for rotating the test head around a first horizontal axis and a second horizontal axis.

7. A manipulator for a test head comprising:
  a) a column;
  b) a telescoping boom slidably mounted to the column;
  c) a test head assembly suspended below and pivotally mounted to the telescoping boom
  d) a cable support attached to the test head assembly and to the telescoping boom wherein the cable support comprises a plurality of cable support rings.

8. The manipulator of claim 7 wherein each of the plurality of cable support rings has an inner surface and an outer surface, and the inner surface may move relative to the outer surface.

9. The manipulator of claim 8 wherein the inner surface is adapted to clamp a cable.

10. The manipulator of claim 7 wherein a portion of the plurality of cable support rings are connected together through joints which allow the rings to pivot.

11. The manipulator of claim 10 wherein at least one of the cable support rings is connected to the telescoping beam assembly through a ball joint.

12. The manipulator of claim 11 additionally comprising a support member pivotally attached to the telescoping boom assembly and the ball joint is attached to the support member.

13. The manipulator for a test head of claim 7 used for automatic test equipment and adapted to rest on a horizontal floor, wherein:
  a) the test head assembly comprises a cradle;
  b) the telescoping boom forms an horizontal member;
  c) the manipulator additionally comprises means for allowing the horizontal member to pivot about a vertical axis;
  d) the manipulator further comprises means for holding the cradle to the horizontal member while allowing it to pivot about a vertical axis and to rotate about the horizontal axis; and
  e) said means for holding the horizontal member and the means for holding the cradle occupy substantially no floor space below the horizontal member.

14. The manipulator of claim 13 additionally comprising a support plate and wherein the vertical column is pivotally mounted to a support plate.

15. The manipulator of claim 13 wherein the cable support rings support the cable in a horizontal plane while allowing rotation of the cable about an axis along its length.

16. The manipulator of claim 15 wherein the plurality of cable support rings are joined by jointed segments, allowing the cable support to take on a serpentine shape in the horizontal plane.

* * * * *